United States Patent [19]

Jain

[11] Patent Number: 4,910,163

[45] Date of Patent: Mar. 20, 1990

[54] METHOD FOR LOW TEMPERATURE GROWTH OF SILICON EPITAXIAL LAYERS USING CHEMICAL VAPOR DEPOSITION SYSTEM

[75] Inventor: Faquir C. Jain, Storrs, Conn.

[73] Assignee: University of Connecticut, Storrs, Conn.

[21] Appl. No.: 204,609

[22] Filed: Jun. 9, 1988

[51] Int. Cl.⁴ .......................................... H01L 21/20
[52] U.S. Cl. ........................... 437/81; 148/DIG. 57; 148/DIG. 45; 156/610; 437/85; 437/131; 437/171; 437/939
[58] Field of Search ................. 148/DIG. 17, 27, 41, 148/45, 57, 58; 156/610–615, DIG. 64, 67; 118/719, 723, 620; 437/18, 81, 85, 87, 103, 102, 126, 131, 170–178, 937, 939, 746, 971

[56] References Cited

U.S. PATENT DOCUMENTS

| | | | |
|---|---|---|---|
| 2,692,839 | 10/1954 | Christensen et al. | 437/81 |
| 3,065,116 | 11/1962 | Marinace | 437/81 |
| 3,089,788 | 5/1963 | Marinace | 156/613 |
| 3,184,348 | 5/1965 | Marinace | 437/81 |
| 3,345,209 | 10/1967 | Cheroff et al. | 156/613 |
| 3,354,004 | 11/1967 | Reisman et al. | 437/81 |
| 3,361,600 | 1/1968 | Reisman et al. | 437/81 |
| 3,428,500 | 2/1969 | Maeda | 437/103 |
| 3,454,434 | 7/1969 | Jackson, Jr. et al. | 437/81 |
| 3,490,961 | 1/1970 | Frieser et al. | 437/173 |
| 3,563,816 | 2/1971 | Iida et al. | 156/610 |
| 3,600,242 | 8/1971 | Berkenblit et al. | 156/612 |
| 3,783,009 | 1/1974 | Tramposch | 437/81 |
| 4,263,336 | 4/1981 | Thompson et al. | 437/173 |
| 4,279,669 | 7/1981 | Braun et al. | 156/612 |
| 4,401,687 | 8/1983 | Rosler et al. | 427/39 |
| 4,547,404 | 10/1985 | Campbell et al. | 427/248.1 |
| 4,579,609 | 4/1986 | Reif et al. | 437/170 |
| 4,772,356 | 9/1988 | Schumaker et al. | 156/613 |

Primary Examiner—Brian E. Hearn
Assistant Examiner—William Bunch

[57] ABSTRACT

Silicon epitaxial layers are grown on oriented silicon substrates using an open-tube $Si-I_2$ chemical vapor deposition (CVD) reactor in the temperature range of 650°–740° C. Hydrogen and inert gases such as helium and argon are used as carrier gases, and the iodine/carrier gas mixture contacts the silicon source to produce silicon iodide which disproportionates to deposit pure silicon epitaxial layers on the substrate.

16 Claims, 2 Drawing Sheets

METHOD FOR LOW TEMPERATURE GROWTH OF SILICON EPITAXIAL LAYERS USING CHEMICAL VAPOR DEPOSITION SYSTEM

BACKGROUND OF THE INVENTION

The deposition of silicon epitaxial layers on silicon and other substrates/surfaces, such as sapphire and gallium arsenide, is a basic processing step in the fabrication of integrated circuits. Typically, homoepitaxial films of silicon are grown using silane dichlorosilane, ($SiH_2Cl_2$), trichlorosilane ($SiHCl_3$), or silicon tetrachloride ($SiCl_4$) in the temperature range of 1000°–1200° C. Low-temperature growth has recently drawn increased attention due to the superior control of film thickness and dopant redistribution, particularly in the fabrication of submicron geometry devices.

Laser-induced chemical vapor deposition (LCVD), reduced pressure CVD, plasma enhanced CVD (PECVD), molecular beam epitaxy (MBE), and ultrahigh vacuum CVD (UHVCVD) have been investigated as alternatives to conventional silicon epitaxial techniques. An additional advantage of the low-temperature growth techniques such as ultra high vacuum CVD and MBE is the controlled growth of abrupt thin layers of high quality silicon.

There has remained a need to develop a simple but effective relatively low temperature process which is adapted to industrial use and which enables convenient doping during deposition of the silicon onto the substrate. It is also desirable to provide a continuous process using a reactor which permits removal and insertion of reactants and removal of product as the process continues.

It is an object of the present invention to provide a novel, continuous flow relatively low temperature process for depositing epitxial layers of silicon and silicon alloys upon substrates, in which the process is readily adapted to industrial use.

It is also an object to provide such a process which is adapted to the deposition of silicon-germanium alloys.

Another object is to provide such a process which enables facile in situ doping of the film as it is being deposited, and facile introduction and removal of materials during the continuing process.

SUMMARY OF THE INVENTION

It has now been found that the foregoing and related objects may be readily attained in a process for growing epitaxial layers of pure silicon upon a substrate, in which there is initially produced a gaseous stream of iodine and a carrier gas selected from the group consisting of hydrogen, inert gases, and mixtures thereof. This gaseous stream is passed through pure silicon chunks or particulate in a reaction zone having a temperature of 1000°–1150° C. to produce a gaseous stream containing silicon diiodide ($SiI_2$). This gaseous stream containing silicon diiodide is in turn passed over a substrate in a deposition zone at a flow velocity of about 50–350 centimeters per minute, and the temperature in this zone is maintained at 550°–800° C. In this zone, the silicon diiodide is disproportionated and silicon is deposited in epitaxial layers on the substrate.

Preferably, the carrier gas is hydrogen, or a mixture with inert gas in which hydrogen predominates. The iodine gas is produced by heating iodine at a temperature of 60°–120° C. as the carrier gas flows thereabout.

Desirably, a dopant is introduced into the substrate deposition zone as the gaseous stream flows therethrough and the silicon layer is being deposited on the substrate. A gas discharge plasma may be produced in the deposition zone to facilitate disproportionation of the silicon iodide.

In one embodiment of the process, a germanium iodide component may be provided in the gaseous stream to deposit a silicon/germanium alloy on the substrate.

Normally, the substrate will be a semiconductor, and the pressure in the reaction zone and deposition zone will be atmospheric to slightly above atmospheric.

DETAILED DESCRIPTION OF THE INVENTION

As indicated above, the process of the present invention involves the production of a gaseous stream of iodine and a carrier gas which is passed through pure silicon particulate to form a gaseous stream containing silicon diiodide. This gaseous stream is then passed over a substrate as the silicon diiodide disproportionates to produce an epitaxial silicon layer upon the substrate.

Figure 1:
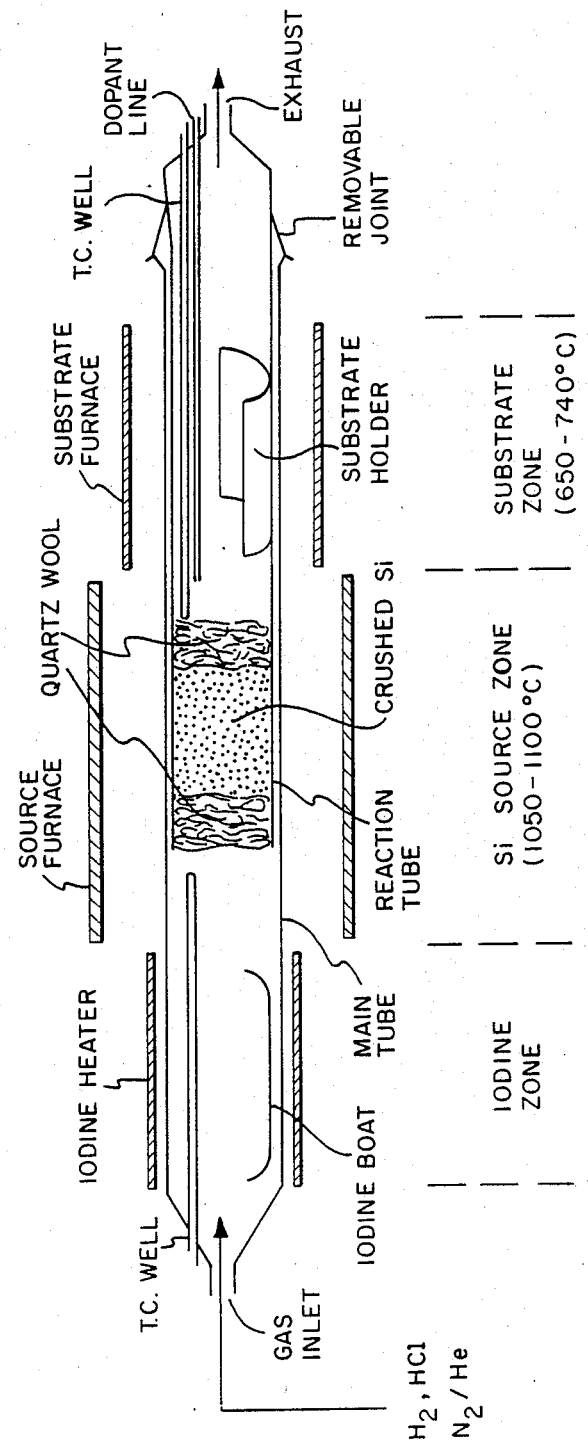
FIG. 1 is a schematic illustration of a tubular reactor for conducting the method of the present invention.

Turning first to FIG. 1, it can be seen that the carrier gas is introduced into one end of a continuous tubular reactor which is divided into three zones. In the first zone, an iodine boat contains iodine crystals, and a resistance heater surrounds this zone of the reactor to elevate the temperature so that iodine is vaporized and admixes with the carrier gas.

The center of the reactor is packed with pure silicon particulate which is held in position by wads of quartz wool to permit the gaseous stream to pass therethrough. This zone is also heated by a resistance heater but to a higher temperature.

The last zone of the tubular reactor contains a substrate holder upon which the substrate is placed. The silicon diiodide in the gaseous stream entering this zone passes over the substrate and is disproportionated to deposit silicon upon the substrate. This zone of the reactor is also heated by a resistance heater, but to a lower temperature than the silicon source zone.

As is diagrammatically illustrated, wells are provided for thermocouples to permit measurement and control of the temperatures in the several zones. In addition, the substrate deposition zone has a conduit for introducing a dopant gas mixture.

Figure 2:
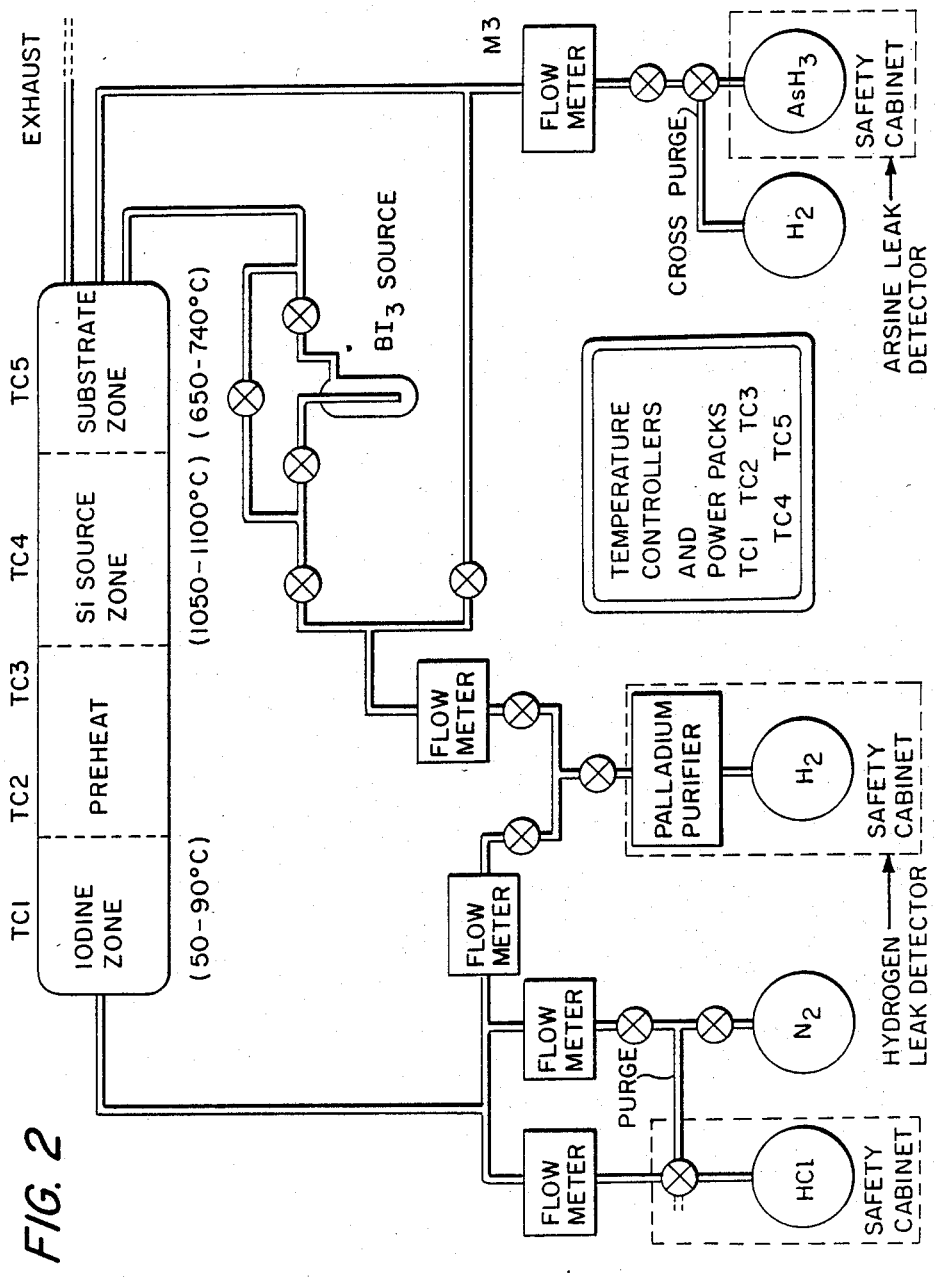
FIG. 2 is a detailed schematic illustration of the reaction assembly.

FIG. 2 illustrates in greater detail the apparatus for conducting the method. The apparatus also consists of a source of hydrogen chloride gas which can be fed through the tubular reactor to etch the Si substrates to improve the deposition and bonding of the silicon thereon. Also shown is a source of nitrogen to purge the system following the passage of the hydrogen chloride therethrough.

The carrier gas hydrogen is shown as passing through a palladium purifier and thereafter branches through suitable valves to function either as the carrier gas for the iodine mixture or for an admixture with boron triiodide as a boron dopant. A separate source of arsine is provided when arsenic is desired as the dopant, and it has its own separate source of hydrogen.

In the iitial iodine zone of the reactor, the temperature is preferably maintained within the range of 60°–120° C. and preferably at 90°–110° C. to vaporize the iodine. A pressure of 30–45 mm mercury is desirably maintained in the iodine vaporization zone. The mixture of iodine and carrier gas then passes through the silicon particulate which is maintained at a temperature of 1000°–1150° C., and preferably 1080°–1110° C.; the iodine reacts with silicon to produce silicon diiodide which then exits this reaction zone as a part of the gas stream.

In the deposition zone, the temperature is maintained within the range of 550°–800° C. and preferably 670°–720° C. The flow velocity of the gas through this deposition zone is maintained at 50–350 centimeters per minute and preferably 150–200 centimeters per minute.

As previously indicated, dopants can be introduced into the deposition zone in gaseous form to admix with the gaseous stream exiting the silicon reaction zone so that concurrent deposition of dopant and silicon will take place upon the substrate.

The epitaxial growth rates have been found to range between 0.5–0.75 microns per hour when the iodine source pressure is within the range of 20–27 mm mercury, the substrate temperatures are within the range of 700°–740° C. and carrier gas velocities of 225–150 centimeter per minute are utilized. These reduced deposition ranges rates compared with the rates experienced in a number of other processes are considered to improve the ability to obtain good submicron geometry in extremely thin layered structures.

The silicon source material can comprise chunks of silicon, ground silicon, or any other form of particulate silicon of high purity so that the iodine containing gaseous stream may effectively react therewith to produce the required silicon diiodide.

Similarly, the substrates may vary but generally silicon wafers ar preferred, and preliminary etching with hydrogen chloride is desirable to improve the deposition and bonding of the silicon layer thereto.

Examplary of the efficacy of the present invention is the following specific example:

A quartz tube reactor substantially as shown in FIG. 2 with a length of about 4 feet and having an inside diameter of 28 mm. Crushed silicon was placed in a center silicon source zone of about 8 inches in length. An iodine boat was placed in an initial zone of about 8 inches and it was filled with iodine crystals, and a preheater zone was provided between the initial and silicon source zones. A silicon wafer was placed in a substrate holder in the terminal zone which comprised the remainder of the length. Initially, a stream of hydrogen chloride was passed through the reactor to etch the surface of a silicon wafer having a surface of 1 cm$^2$ and having an orientation of <100>, and the reactor was then purged with hydrogen. Hydrogen was then introduced into the reactor at a flow rate of 1000 cc. per minute. The temperature in the first zone was maintained at 100° C. to vaporize the iodine and the pressure in hat zone was 45 mm mercury.

The temperature in the silicon source zone was maintained at approximately 1100° C., and the temperature in the deposition zone was maintained at 704° C.

The gaseous mixture of hydrogen and silicon iodide continued from the ioine vaporization zone through the preheater zone, silicon source zone and thence through the deposition zone containing the silicon wafer substrate. The flow velocity through the exit from the substrate deposition zone was determined to be 162 cm. per minute.

The process was continued for a period of approximately forty-five minutes, and the wafer containing the epitaxial silicon deposit was then removed. Measurement established the thickness of the deposit at 0.58 micron indicating a growth rate of approximately of 0.0128 microns per minute. The scanning electron photomicrographs taken of the structure showed an extremely smooth surface indicating a mirror smooth deposit.

Thus, it can be seen from the foregoing detailed specification and attached drawings that the process of the present invention provides a relatively simple and effective method to produce epitaxial silicon deposits of extremely high quality and under conditions which permit industrial utilization. Access to the reactor may be obtained during the process itself for the introduction of reactants, and for the removal of products. Moreover, the process is one which readily lends itself to variations to produce alloy deposits.

Having thus described the invention, what is claimed is:

1. In a process for growing epitaxial layers of pure silicon upon a substrate, the steps comprising:
   (a) producing a gaseous stream of iodine and a carrier gas selected from the group consisting of hydrogen, inert gases, and mixtures thereof;
   (b) passing said gaseous stream through finely divided pure silicon in a reaction zone having a temperature of 1000°–1150° C. to produce a gaseous stream containing silicon iodide ($SiI_2$); and
   (c) passing said gaseous stream containing silicon diodide flow velocity of 50–350 cubic centimeters per minute over a substrate in a deposition zone having a temperature of 550°–800° C. to disproportionate the silicon iodide and deposit silicon epitaxial layers on the substrate.

2. The process in accordance with claim 1 wherein said carrier gas is hydrogen.

3. The process in accordance with claim 1 wherein iodine is produced by heating iodine at a temperature of 60°–120° C. as the carrier gas flows thereabout.

4. The process in accordance with claim 1 including the step of introducing a dopant into the substrate deposition zone as the gaseous stream flows therethrough and the silicon layer is being deposited on the substrate.

5. The process in accordance with claim 1 including the step of producing a gas discharge plasma in the deposition zone to facilitate disproportionation of the silicon iodide.

6. The process in accordance with claim 1 wherein there is included the step of producing a germanium iodide component in the gaseous stream to deposit a silicon/germanium alloy on the substrate.

7. The process in accordance with claim 1 wherein the substrate is a semiconductor.

8. The process in accordance with claim 1 wherein the pressure in the reaction zone and deposition zone is atmospheric to slightly above atmospheric.

9. In a process for growing epitaxial layers of pure silicon upon a substrate, the steps comprising:
   (a) producing a gaseous stream of iodine and a carrier gas selected from the group consisting of hydrogen, inert gases, and mixtures thereof, by heating iodine in the presence of the carrier gas;
   (b) passing said gaseous stream through finely divided pure silicon particulate in a reaction zone having a temperature 1000°–1150° C. to produce a gaseous stream containing silicon diiodide ($SiI_2$); and (c) passing said gaseous stream containing silicon diodide at a flow velocity of about 50–350 centimeters per minute over a semiconductor substrate in a deposition zone having a temperature of 550°–800° C. to disproportionate the silicon diiodide and deposit silicon epitaxial layers on the substrate, the pressure in the several zones being within the range of substantially atmospheric to slightly above atmospheric.

10. The process in accordance with claim 9 wherein said carrier gas is hydrogen.

11. The process in accordance with claim 9 wherein the iodine is heated at a temperature of 60°–120° C.

12. The process in accordance with claim 9 including the step of introducing a dopant into the substrate deposition zone as the gaseous stream flows therethrough and the silicon layer is being deposited on the substrate.

13. The process in accordance with claim 9 including the step of producing gas discharge plasma in the deposition zone to facilitate disproportionation of the silicon iodide.

14. The process in accordance with claim 9 wherein there is included the step of producing a germanium iodide component in the gaseous stream to deposit a silicon/germanium alloy on the substrate.

15. The process in accordance with claim 9 including the step of passing a stream of hydrogen chloride passed over the surface of the substrate to etch it before the deposition of silicon.

16. The process in accordance with claim 9 wherein the dopant is introduced as a gaseous stream into the deposition zone to admix with the gaseous stream containing silicon diiodide prior to the passage over the substrate.

* * * * *

UNITED STATES PATENT AND TRADEMARK OFFICE
CERTIFICATE OF CORRECTION

PATENT NO. : 4,910,163
DATED : March 20, 1990
INVENTOR(S) : Faquir C. Jain

It is certified that error appears in the above-identified patent and that said Letters Patent is hereby corrected as shown below:

Column 4, Line 34, after "diodide", insert --at a--; same line after "of", insert --about--; same line after "50-350", delete --cubic--.

Column 4, line 42, after "iodine" (first reference) insert --gas--.

Column 5, line 1, after "temperature" insert --of--.

Signed and Sealed this

Thirteenth Day of August, 1991

Attest:

HARRY F. MANBECK, JR.

*Attesting Officer*    Commissioner of Patents and Trademarks